United States Patent [19]
Chodora

[11] Patent Number: 5,422,539
[45] Date of Patent: Jun. 6, 1995

[54] HIGH-PRESSURE, THERMALLY HIGHLY LOADED DISCHARGE LAMP, AND METHOD TO MAKE ELECTRODES THEREFOR

[75] Inventor: Josef Chodora, Grossaitingen, Germany

[73] Assignee: Patent-Treuhand-Gesellschaft F. Elektrische Gluehlampen mbH, Munich, Germany

[21] Appl. No.: 101,182

[22] Filed: Aug. 3, 1993

[30] Foreign Application Priority Data

Sep. 2, 1992 [DE] Germany .................. 42 29 317.0

[51] Int. Cl.⁶ .................. H01J 61/04; H01J 9/02
[52] U.S. Cl. .................. 313/631; 313/571; 313/311; 313/357; 445/49; 148/649
[58] Field of Search ............ 313/631, 632, 311, 326, 313/357, 570, 571, 335; 140/71.5; 373/88; 445/49, 50; 148/649

[56] References Cited

U.S. PATENT DOCUMENTS

| | | | |
|---|---|---|---|
| 2,670,451 | 2/1964 | Freeman et al. | 313/357 X |
| 4,117,367 | 9/1978 | de Bie et al. | 445/50 X |
| 4,468,586 | 8/1984 | Hohn | 445/50 X |
| 4,575,343 | 3/1986 | Kin et al. | 445/49 X |
| 4,700,107 | 10/1987 | Fischer | 313/631 |
| 5,258,691 | 11/1993 | Dakin et al. | 313/631 X |
| 5,304,893 | 4/1994 | Nieda | 313/631 |

FOREIGN PATENT DOCUMENTS

| | | |
|---|---|---|
| WO88/04396 | 6/1988 | European Pat. Off. . |
| 2271663 | 12/1975 | France . |
| 3036746A1 | 4/1981 | Germany . |

Primary Examiner—Sandra L. O'Shea
Assistant Examiner—Ashok Patel
Attorney, Agent, or Firm—Frishauf, Holtz, Goodman & Woodward

[57] ABSTRACT

To improve the operation of high-pressure discharge lamps by preventing premature deformation of the end face of an anode due to extremely high temperature, with subsequent vaporization of tungsten material from the electrode and deposition on the bulb or vessel of the high-pressure discharge lamp, the electrode is axially forged, for example by hammering, to compact and change the grain structure of the electrode towards a finer grain than elsewhere in the electrode and increase the hardness of the electrode across the end face surface. Both—higher density and finer grain structure—increase the parameters which characterize the lifetime of electrodes, and hence of the lamp, namely heat conductivity and resistance against deformation under heat stress.

19 Claims, 5 Drawing Sheets

338, 327, 317, 323, 312, 319, 339

357, 366, 361, 337, 354, 345, 357

POSITION OF THE MEASURING POINTS ON THE POLISHED ANODE SPECIMEN
(AXIAL CUT)

HIGH-PRESSURE, THERMALLY HIGHLY LOADED DISCHARGE LAMP, AND METHOD TO MAKE ELECTRODES THEREFOR

FIELD OF THE INVENTION

The present invention relates to high-pressure discharge lamps, and more particularly to the electrode structure in high-power, high-pressure discharge lamps, and to a method to make the electrode. Discharge lamps of the kind to which the present invention relates are frequently used in projectors, for example motion-picture projectors, mask-work projections for exposure of semiconductor chips in micro lithography, and the like.

BACKGROUND

Motion-picture projectors use effectively exclusively xenon high-pressure discharge lamps having power ratings of between about 0.5 to 10 kW. In micro lithography, mercury high-pressure discharge lamps are used with power ratings of between about 0.2 kW and 2 kW. Lamps for both uses are direct current operated, and the light is generated by a d-c arc of high stability extending between a cathode and an anode. The thermal loading on the anode is extremely high.

It is believed that the thermal loading on the anode is caused primarily by entry of electrons during the discharge into the facing end surface of the anode. Usually, the anode has a blunt end surface, and typically a somewhat spherical or frusto-conical end region. Upon entry of electrons, anode heat is generated and has to be dissipated. This heat is caused, in part, by the entrance work or entrance or insertion energy (about 4.4 eV for tungsten), the anode drop (about 1 eV) and the average plasma electron energy (about 1 eV). This heat increases in proportion to the lamp current.

Anodes for such high-pressure discharge lamps usually are made of tungsten, the metal of all metals which has the highest melting point of about 3680 K., and the lowest vapor pressure. The anodes are as large as possible, while still assuring a stable arc. The size should be so selected that it provides the largest possible heat radiating surface in order to obtain lowering of the anode operating temperature. Of course, due to costs and design considerations, as well as size of the overall lamp, the size of the anode cannot be increased beyond relatively narrow limits.

To obtain a low anode end surface temperature which is as low as possible, it is desirable to also provide for effective conduction of anode heat away from the anode front end surface. This requires a high heat conductivity of the tungsten material in the region of the front end surface.

The tungsten material used in making the anode must have high resistance with respect to material creep due to heat. This is particularly important due to the high anode front end surface temperatures. High mechanical strength at high temperature over a long time is expected so that the anode surface does not deform in the region facing the arc. Such deformation may lead to premature failure of the lamp.

Anodes which have insufficient resistance to high temperature creep may generate craters or the like in the region of the front end surface. Additionally, heating and cooling processes occur when the lamp, when cold, is energized, and then, after deenergization, cools again. The resulting thermal stresses may cause fissures at which sooner or later local hot spots will occur during lamp operation which may reach temperatures above the melting point of the tungsten. This leads to increased vaporization of tungsten and thus premature blackening of the discharge vessel, again reducing the effective lifetime of the lamp.

Usually, the tungsten for use in anodes utilizes tungsten rod or stock material which is made in a powder metallurgy process. Pure or doped tungsten powder is compressed into rod shape, and sintered; the thus premanufactured rods are circumferentially swaged, in which the sintered tungsten rod material is reformed and compacted.

The two important parameters for long life of anodes are the heat conduction characteristics and the high temperature creep resistance characteristics. Both of these parameters increase with compaction of the tungsten material. It is believed that the high temperature creep resistance increases not only due to the higher density of the material, but also due to the finer grains of the material which arise upon compaction. The larger numbers of grain boundaries within a unit volume then counteract thermally caused material deformations or shifts and provide greater resistance against material shifting under heat loading.

The deformation and compaction process acting on rod material are hammer forces which act essentially radially on the rod material. Deformation and compaction is done from the lateral surface. As a result, both the high temperature creep resistance and the heat conductivity decrease from the outer or sleeve surface of the rod material towards the center of the rod material.

When a lamp is energized, the arc attaches at about the center region of the anode face surface. That is the region where the highest temperature results. That is also the region where the compaction in accordance with the prior art processes has a minimum effect. Consequently, that central region of the anode has the lowest density, hence the lowest heat conductivity, and the lowest resistance towards creep under high temperature loading.

THE INVENTION

It is an object to improve high-pressure discharge lamps by providing such lamps with improved electrodes and especially anodes, and in which the heat conductivity and creep resistance under thermal stress is improved over that of prior art anodes; and to provide a method for making such anodes.

Briefly, the material of at least part of the end face of at least the anode of the high-pressure lamp is mechanically forged and compacted. This structure can be obtained by providing an electrode blank, and then axially forging at least a portion of the end face of the blank to compact the material thereof, so that the region adjacent the end surface likewise will be forged and compacted.

Thus, forging and compacting the central region of the anode has the advantage that the heat conductivity and resistance against high temperature creep of the tungsten material in the central region of the anode end surface is improved, and thus deformation of the anode, and especially the front end surface, is effectively avoided, exactly at the region where the arc attaches. Resulting local increases in temperatures due to formation of protrusions and fissures, leading to increased vaporization of tungsten can be effectively eliminated or, at least, substantially decreased, so that the lifetime of the lamps is enhanced, and blackening of the lamp envelope surrounding the electrodes is eliminated or at least reduced, or substantially delayed with respect to operating time of the lamp.

The electrode in accordance with the present invention is particularly suitable as the anode of a d-c operated xenon or mercury high-pressure discharge lamp. The characteristics of the anode is that the surface facing the discharge is compacted by axial forging.

In accordance with a feature of the invention, anode blanks are placed in an electrically heated furnace, and heated to about 1400° C. They are then singly removed with suitable tongs from the furnace and placed in a closed die for closed die forging in the die recess, and hammered with a pneumatic forging hammer of about 400 kg weight. About 10-15 impacts within a few seconds forge the blank to the height of the closed die.

This forging operation results in an axial compression of the front or face portion of the anode blank which, usually, is frusto-conical. The compression is by a few millimeters and, in connection therewith, a marked densification of the tungsten material is obtained in this region. Additionally, the grain structure of the material is changed towards a fine grained structure.

DRAWINGS

Figure 5:
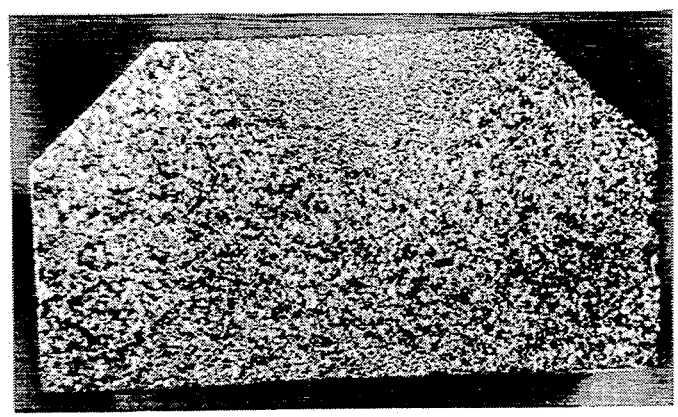
FIG. 5 is a view similar to FIG. 4 of an anode after axial forging and illustrating the axially compacted densification of the end face of the anode.
Figure 6:
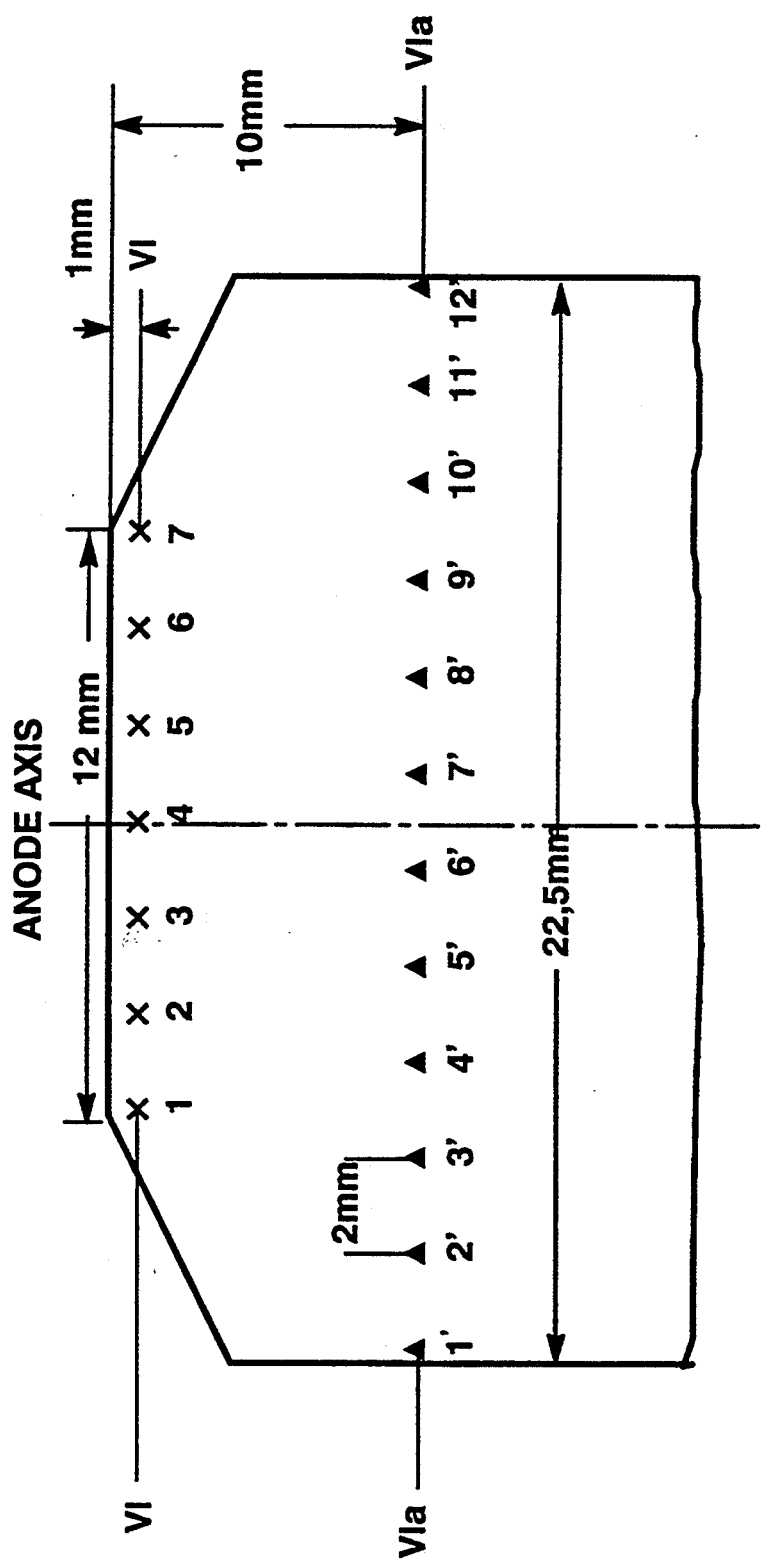
Figure 7:
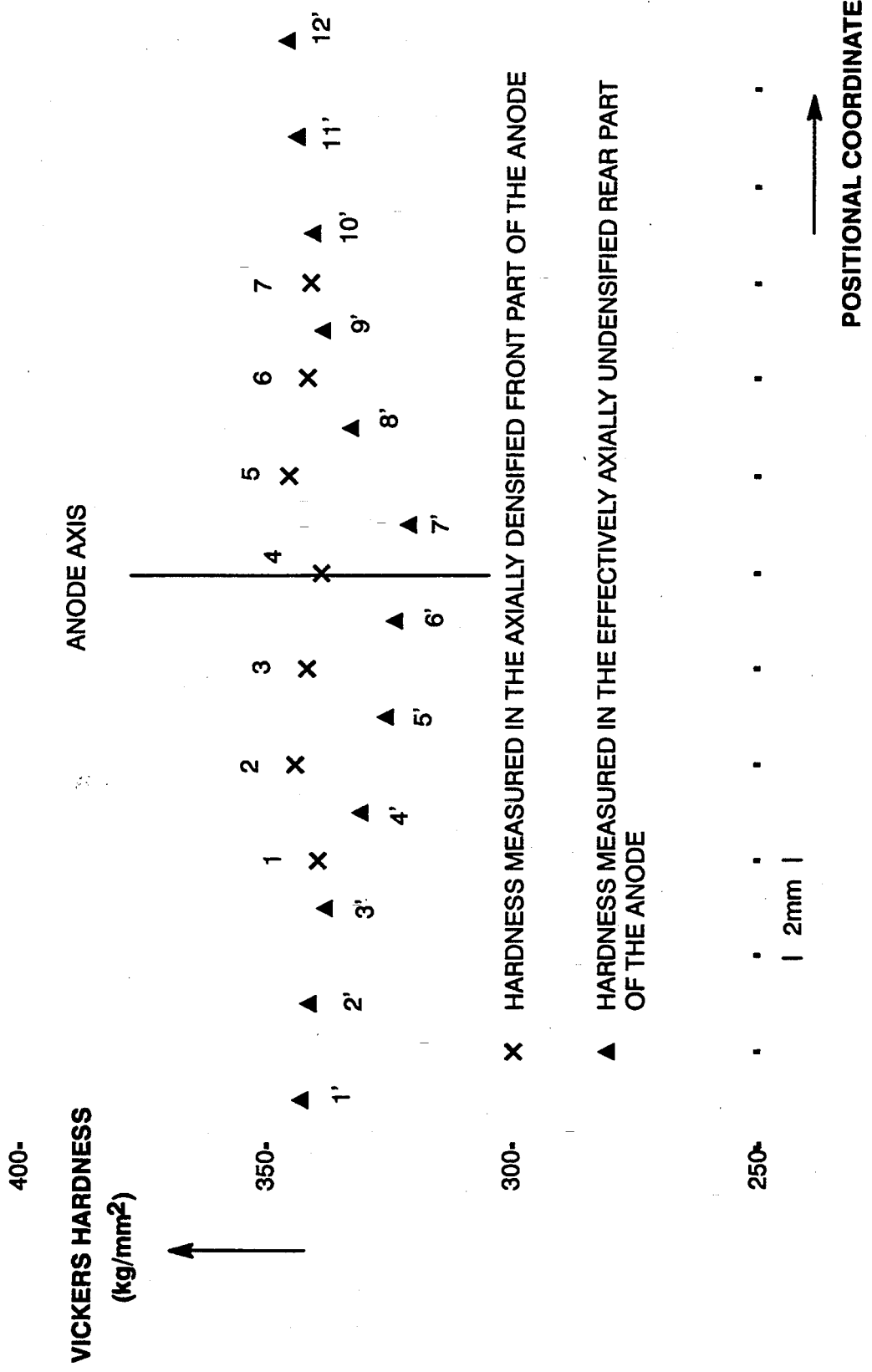

FIG. 6 is a graphic representation of an anode similar to FIG. 5, not to scale, after axial forging, and illustrating the position of the measuring points with respect to hardness; and FIG. 7 is a diagram illustrating the averaged hardness values measured across the axial cross-sectional cut of 7 anodes after axial forging, close to the end face surface (x marks) and about 10 mm below the end face surface (▲ marks).

DETAILED DESCRIPTION

Figure 1:
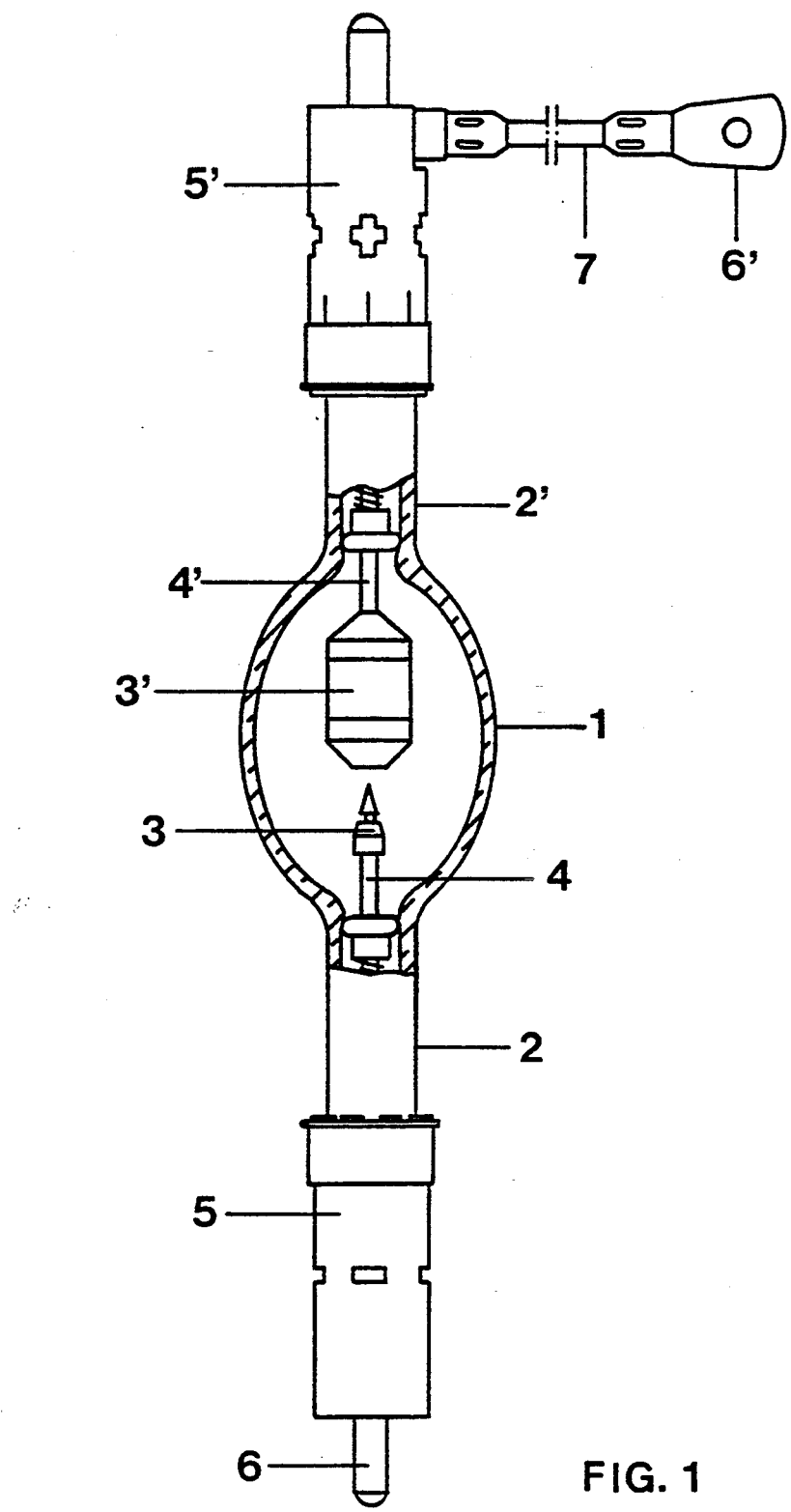
FIG. 1 is a highly schematic side view of a xenon high-pressure discharge lamp of 2.5 kW rating and having the anode electrode of the present invention.

Referring first to FIG. 1:

The lamp of FIG. 1 is a 2.5 kW (nominal rating) d-c xenon high-pressure short-arc discharge lamp. It has a quartz-glass bulb 1, filled with xenon at about 10 bar pressure. It has two necks, 2, 2', also made of quartz glass. Two electrodes are located within the lamp, diametrically opposite each other, spaced by a few millimeters from each other. The cathode electrode 3 is pointed; the anode electrode 3' is substantially larger than the cathode electrode, since it is thermally highly loaded. To obtain high stability of the discharge arc, it is formed in frusto-conical shape at the front end facing the discharge. The electrodes 3, 3' are secured, for current supply, to rods 4, 4', likewise made of tungsten. The electrode rods 4, 4' are melt-sealed in the end portions of the necks 2, 2' to be gas-tight therein, and connected to external current supply leads 6, 6'. Lamp bases 5, 5' are cemented to the necks 2, 2'. The lamp construction, as a whole, is conventional, and standardized. The electrical connection to supply energy at the cathode is obtained by a clamp connection to the base pin 6. The anode is connected to a base cable 7, terminating in a terminal lug 6'. Lamp voltage is only about 28 V, lamp current 90 A. The anode face surface temperature is about 2500 K.

Lamps of this type are used in motion picture projection primarily due to the radiation which matches daylight very closely and, further, due to the high brightness. The lifetime of such lamps with prior art anodes is between 1200 to 1500 hours, and is limited primarily due to blackening of the bulb or vessel 1. The materials used in the lamp—tungsten for the electrodes and connecting rods, quartz glass, xenon—and the relatively high proportion of manual work at the lamp causes the lamps to be expensive. Premature failure of the lamps, thus, is undesirable due to the high cost of the lamps. Increasing the lifetime provides competitive advantages.

Figure 2:
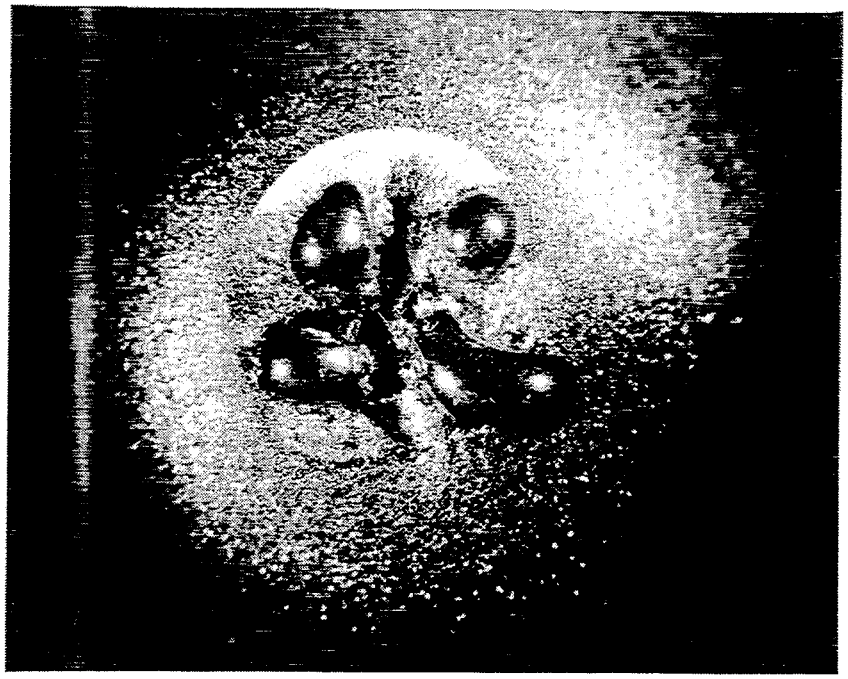
FIG. 2 is a top view of an anode of a 2.5 kW xenon high-pressure discharge lamp in accordance with the prior art after 1200 hours of operation.

FIG. 2 is a photo micrograph of the end face of an anode of a prior art lamp of the type shown in FIG. 1, namely a 2.5 kW rated power lamp, after 1200 hours of operation. As can be clearly seen, the end face surface is highly deformed and shows small melt balls. This indicates that the melting temperature of tungsten, namely 3680 K., has been locally exceeded. Exceeding the melting temperature leads to increased vaporization of the tungsten; the vaporized tungsten deposits on the inside surface of the vessel 1, and the resulting blackening leads to limitation of the useful life of the lamp.

Figure 3:
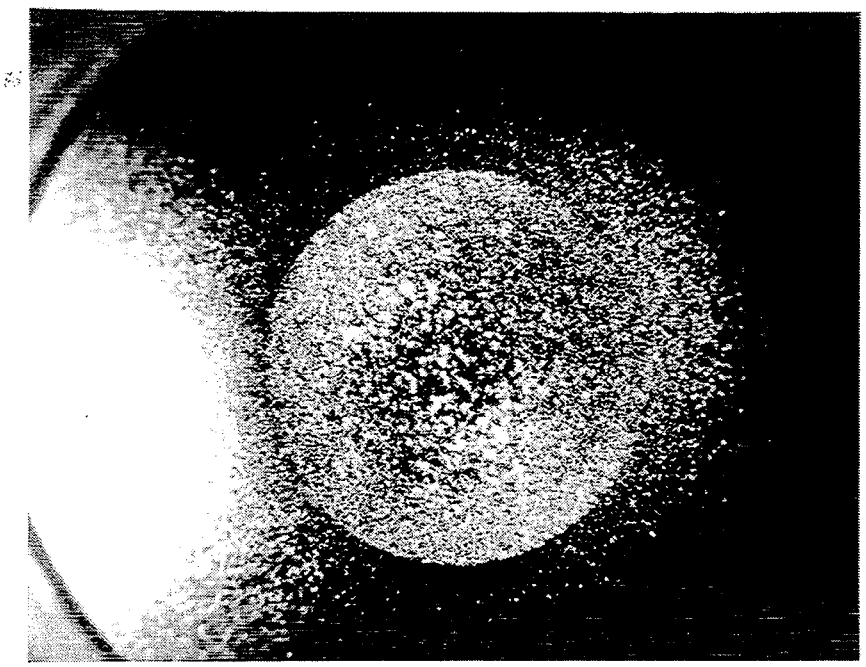
FIG. 3 is a top view of the anode of a 2.5 kW xenon high-pressure discharge lamp having an axially forged end face, after 1200 hours of operation.

FIG. 3 is a top view of an anode of a lamp identical to that shown in FIG. 2, in which, however, the anode is made of the forged, compacted material in accordance with the present invention. Again, the lamp has a rated power of 2.5 kW, and the anode is shown after 1200 hours of operation. As can be seen, the front end surface of the anode is practically free of deformation, and so local temperature not spots are absent. Thus, since there was no increased vaporization of tungsten, the blackening of the bulb was effectively eliminated or, at least, substantially reduced. Lamps of such anodes readily exceed the previously standard lifetime of between 1200 to 1500 operating hours.

Figure 4:
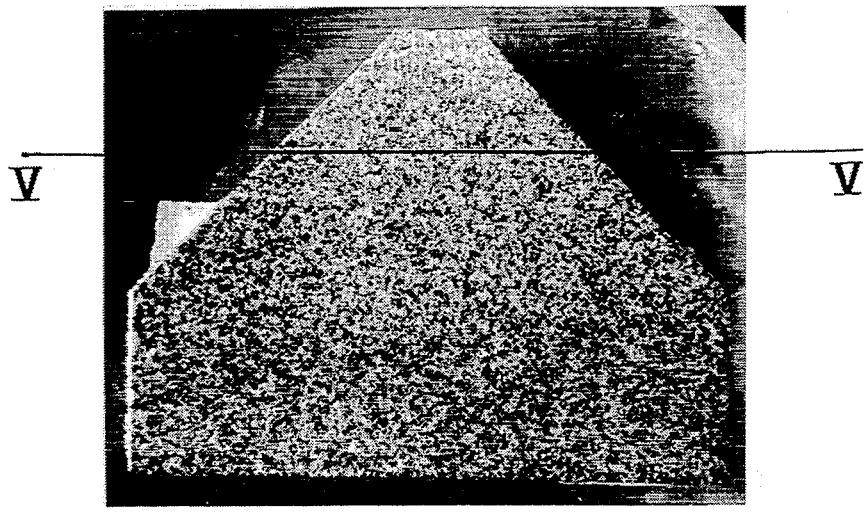
FIG. 4 is a photo micrograph showing an axial cross-sectional cut through an anode blank before axial forging.

FIG. 4 is a photo micrograph of the surface of an axial section of the frusto-conical anode blank before axial forging and compaction. Before forging, the frusto-conical portion of the anode blank had a height of about 8 mm, and the diameter of the end face was only about 3 mm. As can be seen, the grain structure is essentially uniform over the entire blank.

FIG. 4 further illustrates a line V—V. This line shows the position of the anode end surface after compaction (see FIG. 5). The numbers above FIG. 4 show the hardness of the sectioned surface measured as the Vickers hardness HV5 (kg/mm$^2$) of the axially uncompacted blank at the level of the line V—V. In essentially uniformly grained material, hardness is a measure for the density of the tungsten material. Thus, hardness can be used as a secondary measuring parameter for both the heat conductivity and the resistance to deformation under thermal stress. As can be seen, the values are a minimum at the central axis of the electrode, and increase towards the outer or lateral or jacket surface.

FIG. 5 is a photo micrograph of the surface of an axial section of the frusto-conical anode blank after axial forging and compaction. The height of the frusto-conical section has been reduced by axial compaction by about 2.5 mm, and after finish machining by material removal, will be only about 4 mm. The diameter of the end face surface is about 12 mm. The grain structure has become finer in a roughly hemispherical region centered about the central axis, and having a depth of a few mm, as can be clearly seen from FIG. 5.

The numbers above FIG. 5 again are the Vickers hardness HV5 (kg/mm$^2$), measured at approximately equal distances transversely across the sectioned anode surface. The values are clearly above the values of the yet uncompacted blank. The value of "337 at the center" is believed to have been a measuring inaccuracy.

Both compaction as well as change in the micro structure of the grains contribute to increase of the hardness measured at the anode facing surface, and thus improvement in heat conductivity and resistance against deformation under heat.

The numbers indicated on FIGS. 4 and 5 relate to measurements taken about 2 mm from each other, and are single values from a single measurement for the Vickers hardness HV5 (kg/mm$^2$). It is extremely difficult to accurately measure hardness over this surface in small increments. Referring again to FIG. 4, it can be clearly seen that the axial hardness value of 323 is above the immediately adjacent hardness values, but substantially below the lateral-hardness values where circumferential compaction had been done to the raw stock or raw rod material. Considering, however, unavoidable inaccuracies in measured data, it can still be seen that the hardness and, in a homogeneous grain structure, consequentially the density decreases from the outside surface to the central region, or the axis of the electrode.

In FIG. 5, the central value 337 is apparently an individual measuring error. Subsequent hardness measures with six further anode structures provided average values. Measuring points and hardness values measured are graphically shown in FIGS. 6 and 7, respectively; the values are reproduced on tables 1 and 2, in which Table 1 shows the Vickers hardness HV5 of six further anodes adjacent the face surface compacted and densified in accordance with the present invention, and Table 2 shows the hardness at a lower level of the anodes, that is, where the tungsten material is effectively unaffected by forging and hence undensified. The measuring points 1-7 of Table 1 correspond to the measuring points 1-7 on FIGS. 6 and 7; the measuring points 1'-12' correspond to the measuring points 1'-12' on FIGS. 6 and 7. As can be seen, there is substantial deviation in individual measurements at like points. Comparing Tables 1 and 2, and specifically points 4 and points 6', 7', it can be clearly seen that the hardness, as measured at point 4, is substantially higher than the hardness measurements at points 6', 7'; likewise, the hardness at points 3 and 5 of the anode in accordance with the present invention is clearly above the hardness values of points 5', 8' inwardly of the anode.

After axial forging, the outer surfaces of the anode are cut to size on a lathe, or similar machine tool, removing a layer of about 1.5 mm thickness of deformed material from the end facing surface as well as the conical jacket surface. This step results in a substantially homogeneous grain structure at the anode face surface and further to obtain appropriate geometry, size and shape of the anode.

Comparison of the Tables 1 and 2 also shows that the forging action effectively does not penetrate through the entire anode; thus, the measured hardness of Table 2, at the rear, effectively uncompacted region, varies from a higher value at the outer circumference (points 1' and 12') towards a lower value in the central region (points 6', 7').

The photo micrographs of FIGS. 4 and 5 were made by axial cutting, polishing and etching of the respective surfaces. The Vickers hardness HV5 is then measured at measuring distances of 2 mm from each other on a line of about 12 mm length, close to the front end surface, about 1 mm below it, in the forward measuring range, as illustrated by the x marks in FIG. 6. Thus, the measuring line for the values of Table 1 is along the line VI—VI; the measuring line for the rear region of the anode surface was about 10 mm below the anode surface, along line VIa—VIa to provide a comparison with the effectively uncompacted rear region.

As can be clearly seen from Table 1 and FIG. 7, the hardness in the axially compacted region close to the front surface of the anode is quite uniform between the circumference and the region or the center, or axis of the electrode. In the uncompacted, rear region of the electrode, the hardness as shown in Table 2 and in FIG. 7 is significantly less at the axial region, by more than 15 kg/mm$^2$, on the average, than along the lateral surface.

TABLE 1

Vickers hardness (HV5 (kg/mm$^2$) measured in the axially densified front part of the anode specimen in accordance with the invention, along line VI-VI of FIG. 6

| Anode no. | Point 1 | Point 2 | Point 3 | Point 4 | Point 5 | Point 6 | Point 7 |
|---|---|---|---|---|---|---|---|
| 1 | 357 | 366 | 361 | 337 | 354 | 345 | 357 |
| 2 | 332 | 332 | 341 | 341 | 341 | 329 | 336 |
| 3 | 336 | 349 | 345 | 345 | 349 | 347 | 332 |
| 4 | 336 | 341 | 345 | 341 | 341 | 345 | 341 |
| 5 | 342 | 352 | 351 | 348 | 354 | 342 | 342 |
| 6 | 332 | 329 | 321 | 329 | 336 | 341 | 341 |
| 7 | 343 | 341 | 329 | 332 | 345 | 345 | 341 |
| Average | 339.7 | 344.3 | 341.9 | 339.0 | 345.7 | 342.0 | 341.4 |
| Mean deviation | ±8.8 | ±12.7 | ±13.4 | ±6.8 | ±6.9 | ±6.1 | ±7.8 |

TABLE 2

Vickers Hardness HV5 (kg/mm²) measured in the effectively axially undensified rear part of the anode specimen along a line VIa-VIa of FIG. 6

| Anode no. | Point 1' | Point 2' | Point 3' | Point 4' | Point 5' | Point 6' | Point 7' | Point 8' | Point 9' | Point 10' | Point 11' | Point 12' |
|---|---|---|---|---|---|---|---|---|---|---|---|---|
| 1 | 348 | 345 | 336 | 334 | 334 | 327 | 321 | 325 | 331 | 335 | 335 | 341 |
| 2 | 341 | 341 | 338 | 329 | 310 | 329 | 317 | 325 | 332 | 329 | 345 | 347 |
| 3 | 336 | 336 | 336 | 329 | 323 | 321 | 323 | 345 | 345 | 336 | 343 | 336 |
| 4 | 341 | 345 | 345 | 336 | 329 | 329 | 323 | 349 | 345 | 345 | 349 | 345 |
| 5 | 341 | 341 | 332 | 321 | 332 | 321 | 321 | 329 | 343 | 349 | 345 | 349 |
| 6 | 347 | 341 | 345 | 336 | 321 | 317 | 323 | 323 | 341 | 349 | 349 | 345 |
| 7 | 349 | 343 | 336 | 332 | 332 | 325 | 321 | 336 | 336 | 345 | 345 | 362 |
| Average | 343.3 | 341.7 | 338.3 | 331.0 | 325.9 | 324.1 | 321.3 | 333.1 | 339.0 | 341.1 | 344.4 | 346.4 |
| Mean deviation | ±4.8 | ±3.1 | ±4.9 | ±5.3 | ±8.5 | ±4.6 | ±2.1 | ±10.4 | ±6.0 | ±7.8 | ±6.7 | ±8.1 |

Various changes and modifications may be made within the scope of the inventive concept.

I claim:

1. High-pressure discharge lamp having
a gas tight discharge vessel (1);
two electrodes (3, 3') of high melting point material located in the discharge vessel, facing each other, wherein at least one electrode has a blunt end face, facing the other electrode;
current supply means (4, 4') melt-sealed into the discharge vessel and mechanically and electrically connected to the electrodes, for supply of electric energy to the electrodes,
wherein the material of the end face of at least part of at least one of the electrodes is mechanically forged by hammering and thereby compacted.

2. The lamp of claim 1, wherein the structural grain density and grain size of the electrode, at said forged blunt end, face is substantially uniform across the cross section thereof.

3. The lamp of claim 1, wherein the at least one electrode comprises sintered, tungsten powder.

4. The lamp of claim 1, wherein the material of the electrode is tungsten.

5. An electrode for a high-pressure discharge lamp, subjected to high operating temperatures,
wherein said electrode has a blunt end face adapted to form an end attachment surface for a discharge arc, and wherein the material of the electrode, at the blunt end face, or at least part thereof, is mechanically forged and thereby compacted.

6. The electrode of claim 5, wherein the material of the electrode is tungsten.

7. The electrode of claim 6, wherein the tungsten is sintered, tungsten powder.

8. High-pressure discharge lamp having
a gas tight discharge vessel (1);
two electrodes (3, 3') of high melting point material located in the discharge vessel, facing each other, wherein at least one electrode has a blunt end face, facing the other electrode;
current supply means (4, 4') melt-sealed into the discharge vessel and mechanically and electrically connected to the electrodes, for supply of electric energy to the electrodes,
wherein the hardness and grain structure of the at least one electrode is essentially uniform across said end face.

9. The lamp of claim 8, wherein the grain structure of said at least one electrode, in a region adjacent the surface of said blunt end face, is finer grained than in a region remote from said end face.

10. The lamp of claim 8, wherein the at least one electrode comprises sintered, tungsten powder.

11. A method to make an electrode for use in a high-pressure discharge lamp,
comprising the steps of
providing an electrode blank larger than the size of the electrode for use in the lamp, said blank having a blunt end face; and
forging the electrode blank by hammering at least a portion of the blunt end face and changing the grain size of said portion of the blank to be more fine-grained than before forging.

12. The method of claim 11, wherein said forging step is carried out at a temperature of about 1400° C., plus or minus 200° C.

13. The method of claim 11, including the step of removing surface regions of the electrode blank to reduce the blank to a desired electrode size dimension, by material removal from at least one of: the end face of the blank; the lateral faces of the electrode.

14. The method of claim 13, including the step of grinding and optionally polishing at least one of the sized electrode surfaces to obtain the finished electrode.

15. The method of claim 11, wherein the forging step comprises mechanically forging by hammering the electrode blank in an axial direction.

16. The method of claim 11, wherein said blank has approximately frusto-conical form defining a frusto-conical projecting portion; and
wherein said forging and hammering step reduces the height of the frusto-conical portion and widens said frusto-conical portion.

17. The method of claim 12, including the step of introducing said electrode blank into a closed die; and
wherein said forging and hammering step is carried out while the blank is in the closed die.

18. The method of claim 13, wherein said forging step is carried out at a temperature of about 1400° C., plus or minus 200° C.

19. The method of claim 11, wherein the blank comprises sintered, tungsten powder.

* * * * *